United States Patent
Kong et al.

(10) Patent No.: US 9,197,228 B2
(45) Date of Patent: Nov. 24, 2015

(54) CIRCUIT AND METHOD FOR ADJUSTING OSCILLATING FREQUENCY OF AN OSCILLATOR

(71) Applicant: Beken Corporation, Shanghai (CN)

(72) Inventors: Ronghui Kong, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 11 days.

(21) Appl. No.: 14/270,377

(22) Filed: May 6, 2014

(65) Prior Publication Data

US 2015/0270842 A1 Sep. 24, 2015

(30) Foreign Application Priority Data

Mar. 21, 2014 (CN) .......................... 2014 1 0109934

(51) Int. Cl.
*H03B 5/08* (2006.01)
*H03L 7/181* (2006.01)
*H03L 7/18* (2006.01)
*H03B 1/00* (2006.01)
*H03K 3/03* (2006.01)

(52) U.S. Cl.
CPC *H03L 7/181* (2013.01); *H03B 1/00* (2013.01); *H03K 3/0315* (2013.01); *H03L 7/18* (2013.01)

(58) Field of Classification Search
CPC .............. H03B 1/00; H03B 5/08; H03L 7/18; H03K 3/0315
USPC ............ 331/57, 16, 34, 177 R, 177 V, 117 R, 331/117 FE, 167
See application file for complete search history.

(56) References Cited

U.S. PATENT DOCUMENTS

| | | | |
|---|---|---|---|
| 7,317,363 B2 * | 1/2008 | Kousai et al. | 331/177 V |
| 7,605,662 B2 * | 10/2009 | Kobayashi et al. | 331/11 |
| 7,969,248 B1 * | 6/2011 | Whitten et al. | 331/16 |

\* cited by examiner

*Primary Examiner* — Arnold Kinkead
(74) *Attorney, Agent, or Firm* — Perkins Coie LLP

(57) ABSTRACT

A circuit comprises an oscillator, a frequency divider and a comparator. The oscillator generates an oscillating signal (Fvco). The frequency divider is communicatively coupled to the oscillator, divides a frequency of the oscillating signal by a denominator and generates a divided signal. The comparator is communicatively coupled to the oscillator and the frequency divider, and is configured to obtain a first count of the divided signal (Fvco/N) within a predetermined time and a second count of a reference signal within the predetermined time; compare the first count with the second count, and generate a comparison result according to the first count and the second count. The oscillator is further configured to adjust the frequency of the oscillating signal according to the comparison result.

13 Claims, 10 Drawing Sheets

CIRCUIT AND METHOD FOR ADJUSTING OSCILLATING FREQUENCY OF AN OSCILLATOR

CLAIM OF PRIORITY

This application claims priority to Chinese Application No. 201410109934.9 entitled "CIRCUIT AND METHOD FOR ADJUSTING OSCILLATING FREQUENCY OF AN OSCILLATOR", filed on Mar. 21, 2014 by Beken Corporation, which is incorporated herein by reference.

TECHNICAL FIELD

The present application relates to an oscillator, and more particularly but not exclusively to a circuit and method for adjusting oscillating frequency of the oscillator.

BACKGROUND

Conventionally, oscillating frequencies for oscillators are calibrated in the analog domain. It may be desirable to have a circuit and method for adjusting oscillating frequency of the oscillator in a digital domain.

SUMMARY

According to an embodiment of the invention, a circuit comprises an oscillator, a frequency divider, and a comparator. The oscillator generates an oscillating signal ($F_{vco}$). The frequency divider is communicatively coupled to the oscillator and generates a divided signal ($F_{vco}/N_1$) dividing a frequency of the oscillating signal by a denominator ($N_1$). The comparator is communicatively coupled to the oscillator and the frequency divider. The comparator obtains a first count of the divided signal within a predetermined time and a second count of a reference signal within the predetermined time, compares the first count with the second count, and generates a comparison result according to the first count and the second count. The oscillator is further adjusts the frequency of the oscillating signal according to the comparison result.

In another embodiment, a method comprises generating an oscillating signal ($F_{vco}$) by an oscillator; generating a divided signal by dividing a frequency of the oscillating signal by a denominator; obtaining a first count of the divided signal ($F_{vco}/N_1$) within a predetermined time and a second count of a reference signal within the predetermined time; generating a comparison result according to a comparison of the first count and the second count; and adjusting the frequency of the oscillating signal according to the comparison result.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
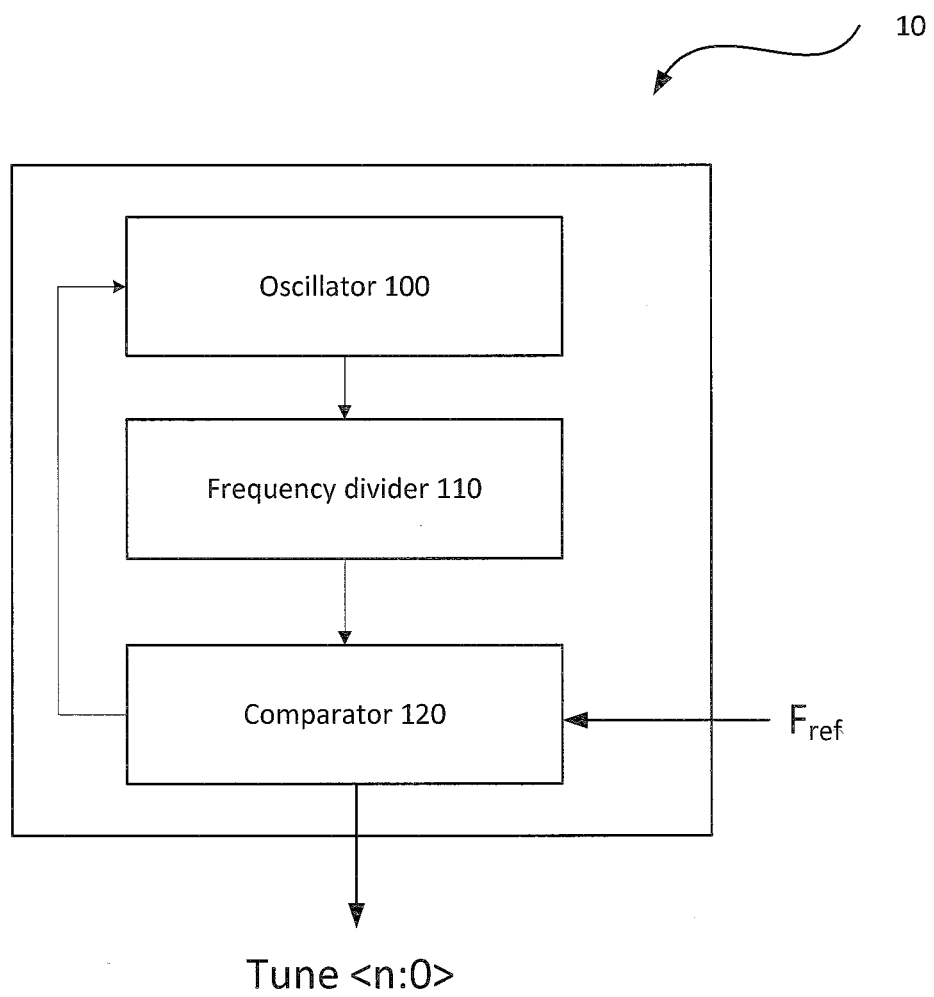
FIG. 1 is a block diagram illustrating a circuit according to an embodiment of the invention.

FIG. 1 is a block diagram illustrating a circuit according to an embodiment of the invention. As shown in FIG. 1, a circuit 10 comprises an oscillator 100, a frequency divider 110 and a comparator 120. The oscillator 100 generates an oscillating signal (Fvco). The frequency divider 110 is communicatively coupled to the oscillator 100 and generates a divided signal (Fvco/$N_1$) by dividing a frequency of the oscillating signal by a denominator ($N_1$). $N_1$ is a denominator, which can also be called a scaler or prescaler. The comparator 120 is communicatively coupled to the oscillator 100 and the frequency divider 110. The comparator 120 obtains a first count of the divided signal within a predetermined time and a second count of a reference signal within the predetermined time, and compares the first count with the second count, and generates a comparison result according to the first count and the second count. The oscillator 100 further adjusts the frequency of the oscillating signal according to the comparison result.

Figure 2:
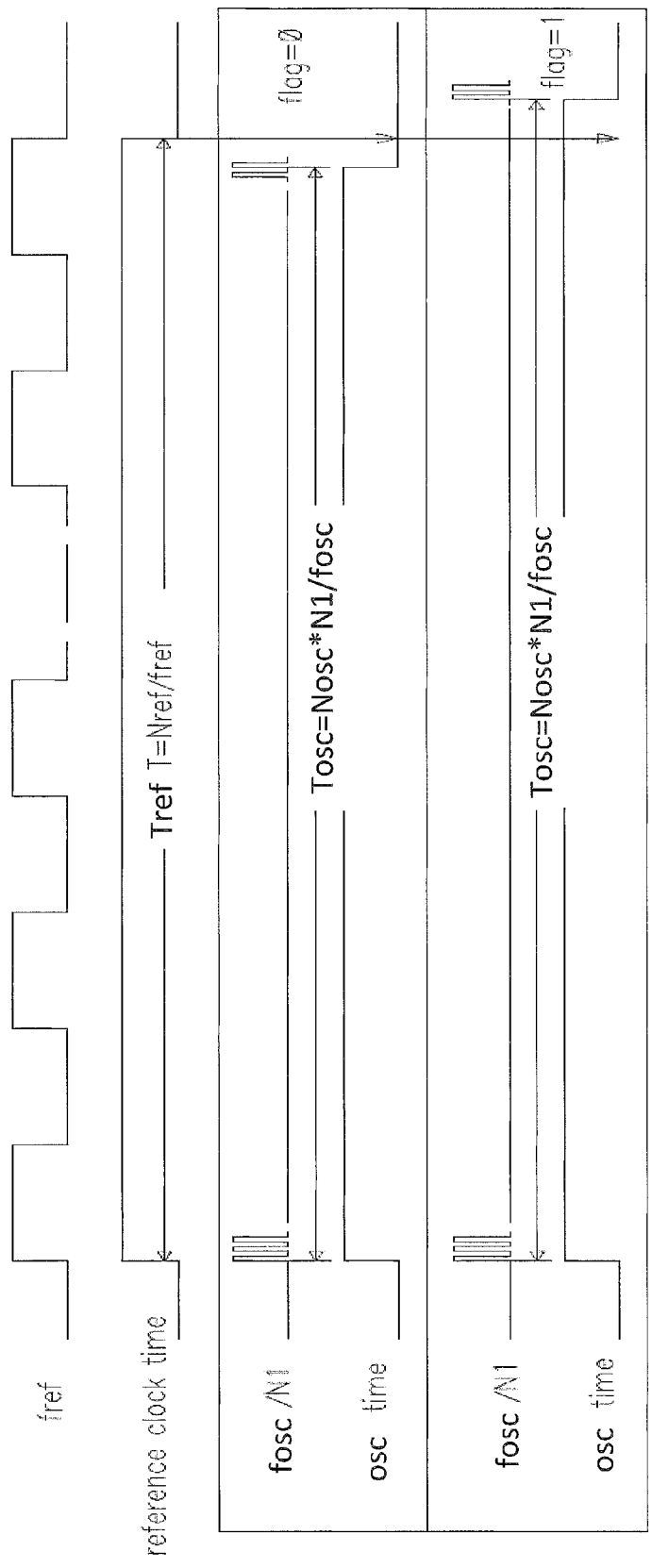
FIG. 2 is a diagram illustrating a timing of a comparison between a first count related to the actual signal with a second count related to the reference signal.

FIG. 2 is a diagram illustrating a timing of a comparison between a first count related to the actual signal with a second count related to the reference signal.

In FIG. 2, $F_{ref}$ represents the frequency of the reference clock. $F_{osc}$ represents the frequency of the oscillator. $N_1$ is the denominator used to divide the frequency $F_{osc}$ of the oscillator. On the one hand, in order to reduce calibration time, $N_1$ should be set as small as possible. On the other hand, the value of $N_1$ should also be limited by the processing requirement of circuit component and the value of the frequency of the oscillator. For example, if the operation frequency of the oscillator is between 2.2 GHz and 2.6 GHz, and the maximum operation frequency of calibration circuit is 500 MHz, then $N_1$ should be larger than 2.6 GHz/500 MHz=5.2. Then $N_1$ should be an integer and take the value of at least 6. $N_{osc}$ is a count of the oscillation of the divided signal oscillator within a predetermined time, which is also called a first count. $N_{osc}$ is determined based on the precision requirement of the circuit. For example, if the operation frequency of the oscillator is between 2.2 GHz and 2.6 GHz, and the precision requirement of the circuit is 1 MHz. The value of $N_{osc}$ can be calculated by the expression that $N_{vco}$=2.6 GHz/1 MHz=2600. $N_{ref}$ is a count of the oscillation of the reference signal within the predetermined time, which is referred to as a second count. $N_{ref}$ can be calculated according to the expression:

$$N_{ref} = \frac{\frac{Nosc}{Fosc/N1}}{Fref} = N_{osc} \times N_1 \times F_{ref}/F_{osc}.$$

A $T_{ref}$ not in equation represents the time for $N_{ref}$-number reference clocks.

A $T_{osc}$ not in equation represents the time for $N_{osc}$-number divided signal of the frequency of $$\frac{fosc}{N1}.$$

Those having ordinary skill in the art can chose an appropriate value for the predetermined time.

If within the predetermined time the first count $N_{osc}$ is larger than the second count $N_{ref}$, it means the frequency of the oscillator is too high. Otherwise, if within the predetermined time the first count $N_{osc}$ is smaller than the second count $N_{ref}$, it means the frequency of the oscillator is too low.

Figure 3:
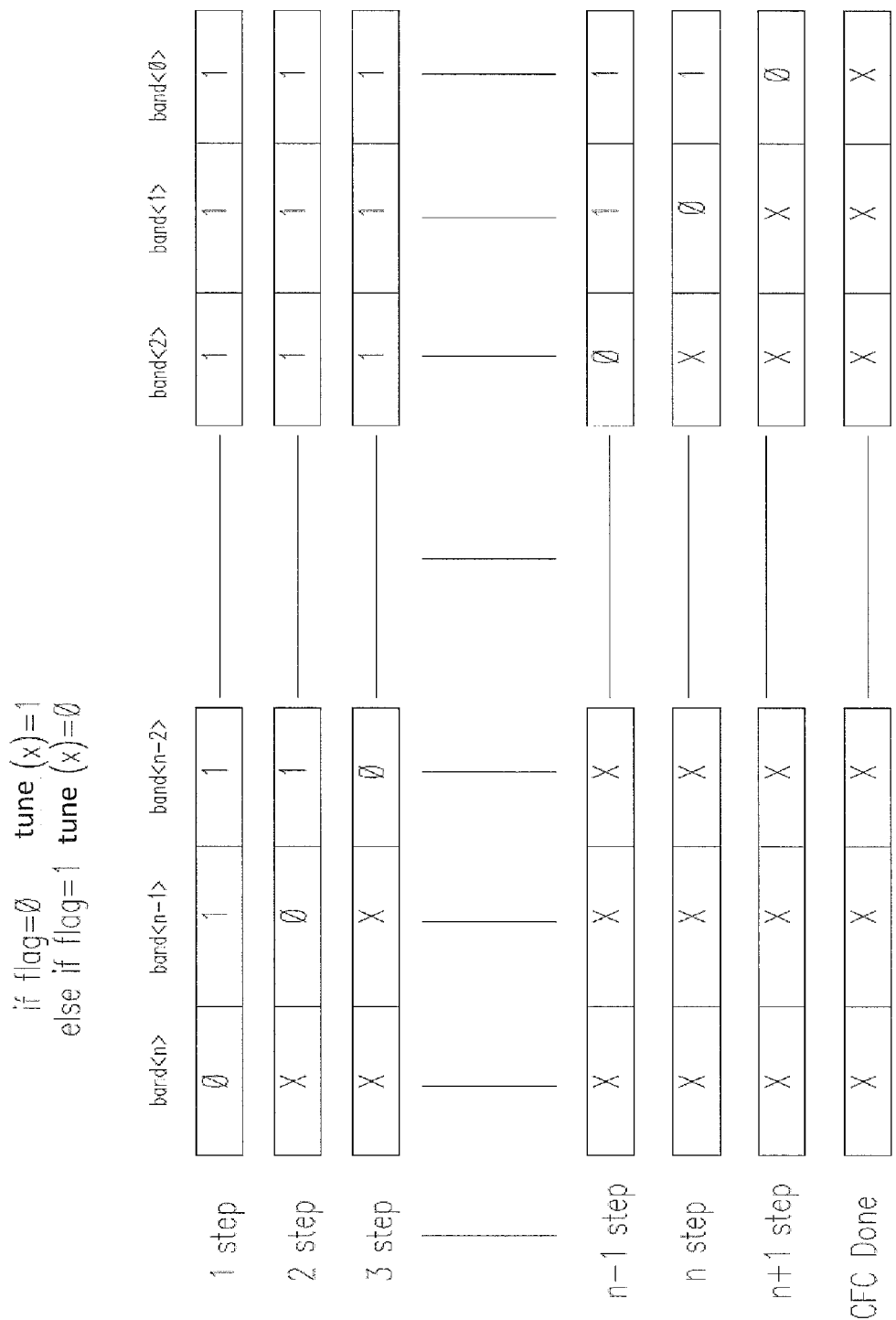
FIG. 3 is a diagram illustrating a process of determining parameters of the oscillator according to an embodiment of the invention.

In other word, the circuit counts both the duration $T_{osc}$ for a target number of $N_{osc}$ oscillation of the divided signal, and the duration $T_{ref}$ for $N_{ref}$-number reference clocks. If $T_{ref} > T_{osc}$, it means that the frequency of the oscillator is too high. If $T_{ref} < T_{osc}$, it means that the frequency of the oscillator is too low. As shown in FIG. 2, $T_{ref} < T_{osc}$, and it is marked as flag=0. For the situation of $T_{ref} > T_{osc}$, it is marked as flag=1. If flag=0, then the corresponding bit Tune <x> of Tune <n:0> of a capacitor array should be set to 1. The capacitor array will be described in further detail below with reference to FIG. 5. Otherwise if flag=1, then the corresponding bit Tune <x> of Tune <n:0> should be set to 0, as shown in FIG. 3. Wherein initially all but the most significant bit (MSB) are set to 1. In FIG. 3, x represents the bit which has already been determined.

Figure 4:
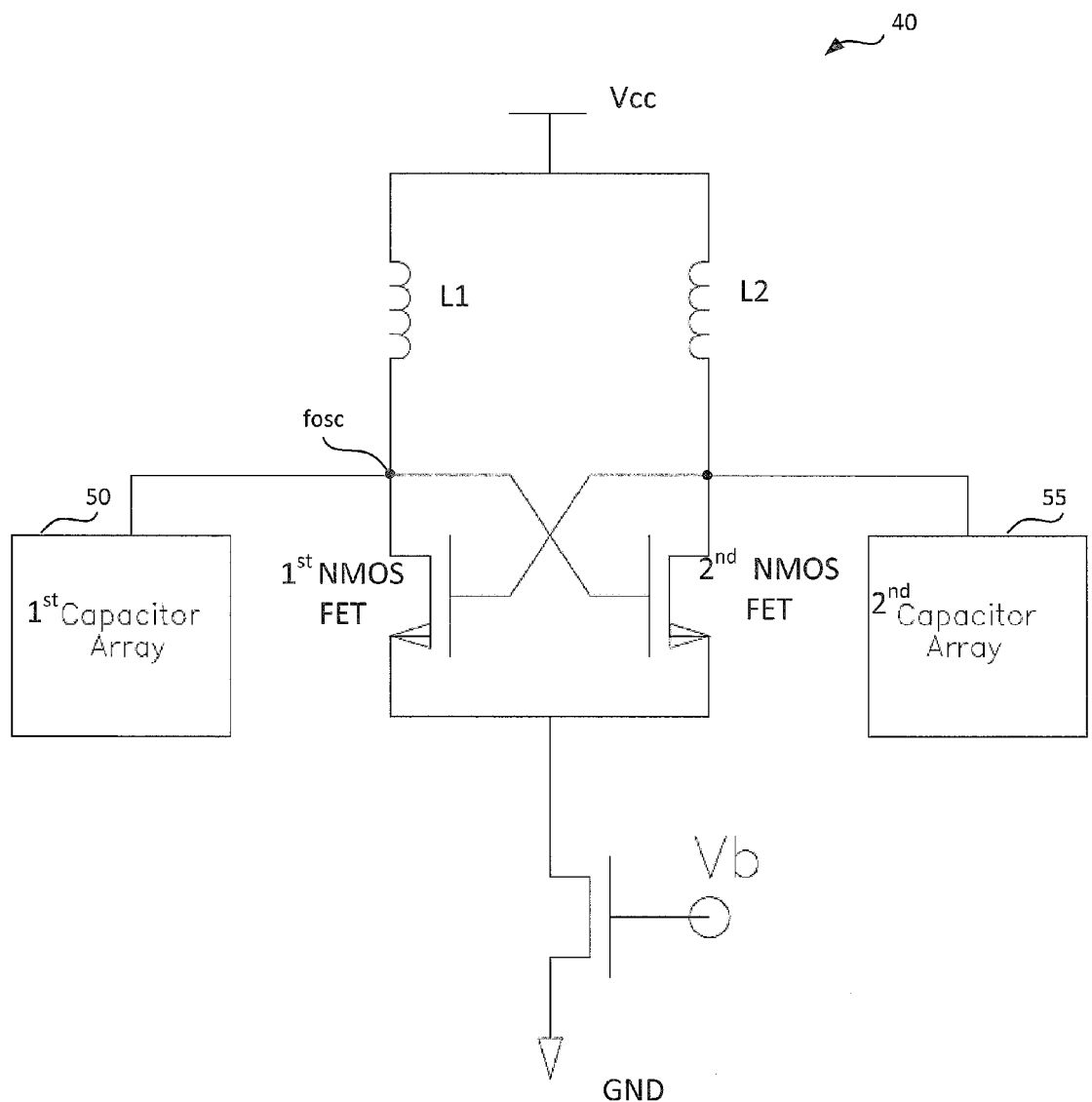
FIG. 4 is a circuit diagram illustrating a structure of the oscillator according to an embodiment of the invention.

FIG. 4 is a circuit diagram illustrating a structure of an oscillator according to an embodiment of the invention. As shown in FIG. 4, the oscillator 40 comprises a first inductor $L_1$ communicatively coupled to a first capacitor array 50. The first capacitor array 50 increases the capacitance of the first capacitor array 50 if the comparison result indicates that the first count is larger than or equal to the second count. Alternatively, the first capacitor array 50 decreases the capacitance of the first capacitor array 50 connected to the first inductor if the comparison result indicates that the first count is smaller than the second count. Further, the oscillator 40 further comprises a second inductor $L_2$, a second capacitor array 55, a first NMOS FET, a second NMOS FET. The first capacitor array 50 is connected to both a gate of the second NMOS FET and a drain of the first NMOS FET. The first inductor is connected between the Vcc and the drain of the first NMOS FET. A source of the first NMOS FET is connected to ground. The drain of the first NMOS FET outputs the oscillating signal.

The second capacitor array 55 is connected to both a gate of the first NMOS FET and a drain of the second NMOS FET. The second inductor is connected between the Vcc and the drain of the second NMOS FET. A source of the second NMOS FET is connected to ground.

Further, the sources of both the first NMOS FET and the second NMOS FET are connected to ground via a third NMOS FET, wherein the source of the first NMOS FET is connected to a drain of the third NMOS FET, a source of the third NMOS FET is connected to ground, and a gate of the third NMOS FET is connected to a bias voltage $V_b$.

Figure 5:
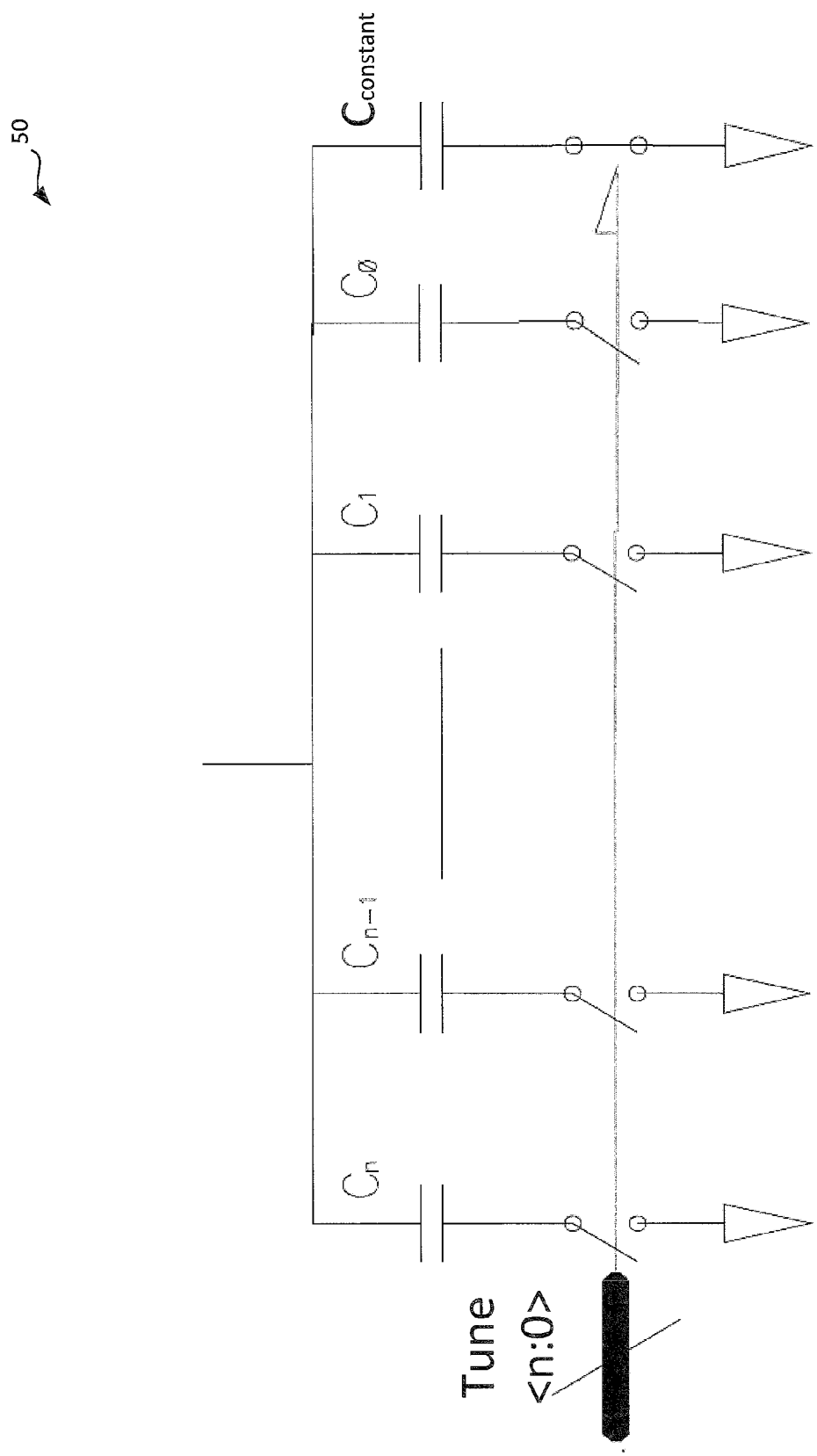
FIG. 5 is a circuit diagram illustrating a topology of a capacitor array shown in FIG. 4 according to an embodiment of the invention.

FIG. 5 is a circuit diagram illustrating a topology of a first capacitor array 50 shown in FIG. 4 according to an embodiment of the invention.

As shown in FIG. 5, the first capacitor array 50 comprises a plurality of individually switched capacitors. In one embodiment, the capacitances of the plurality of the individually switched capacitors are arranged in a binary order according to the equation $C_n = 2 \times C_{n-1}$. In other words, $C_n = 2^n \times C_0$. For example, $C_1 = 2 \times C_0$, $C_2 = 4 \times C_0$. For a processing of 0.18 μm, the minimum capacitor can be 3 μm×3 μm, with the capacitance of 9 femtofarad (fF). In order to meet a target calibration precision, a least significant bit (LSB) $C_0$ should be 3 fF and the n of $C_n$ should be 9.3 fF capacitance can be implemented by three 3 μm×3 μm capacitors connected in series. The overall number of 3 μm×3 μm capacitors should be 3069. Note that if the frequency range of the oscillator does not start from zero, for example, if the operation frequency of the oscillator ranges from 2.2 GHz to 2.6 GHz, the first capacitor array 50 may further comprises a constant capacitor $C_{constant}$ whose capacitance can be calculated based on the expression of $$f = \frac{1}{2\pi\sqrt{LC}}.$$

In another embodiment, a capacitance of a first capacitor $C_n$ is less than the sum of capacitances of all the other capacitors $C_{n-1}, C_{n-2}, \ldots C_1, C_0$ that are less than the first capacitor $C_n$ and the capacitance of a least significant bit of the first capacitor array 50. In other words, $C_n < C_{n-1} + C_{n-2} + \ldots + C_1 + C_0 + C_0$. In order to meet a target calibration precision in the above embodiment, the least significant bit (LSB) $C_0$ should be 3 fF which can be implemented by three 3 μm×3 μm capacitors connected in series. $C_1$ can be implemented by two $C_0$ connected in parallel. Therefore the capacitance of $C_1$ is 6 fF. $C_2$ is a 3 μm×3 μm capacitance. $C_3$ can be implemented by two $C_1$ connected in parallel. $C_4$ can be implemented by four $C_1$ connected in parallel. $C_n$ can be implemented by $2^{n-2}$ number of $C_2$, n>2. For example, $C_9 = 2^{9-2} = 128$ number of $C_2$. Therefore this capacitance array comprises 264 3 μm×3 μm capacitors. Those having ordinary skill in the art can understand that the above two embodiments for the values of capacitance for the first capacitor array 50 can also be applied to the second capacitor array 55.

Figure 6:
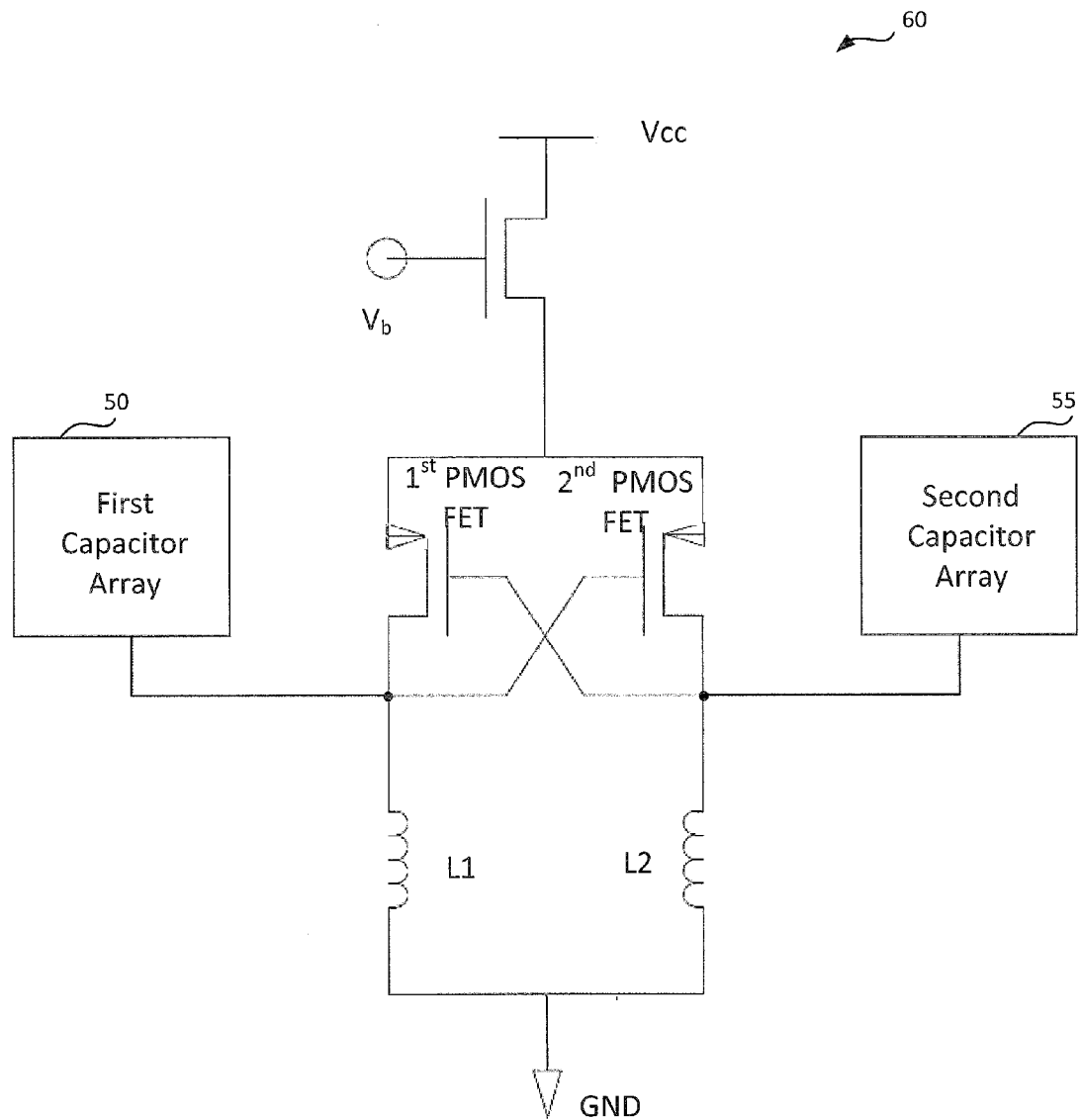
FIG. 6 is a circuit diagram illustrating a structure of the oscillator according to another embodiment of the invention.

FIG. 6 is a circuit diagram illustrating a structure of an oscillator according to another embodiment of the invention.

As shown in FIG. 6, alternatively, the oscillator 60 comprises a first inductor $L_1$ communicatively coupled to a first capacitor array 50, a second inductor $L_2$, a second capacitor array 55, a first PMOS FET, a second PMOS FET. The first capacitor array 50 is connected to both a gate of the second PMOS FET and a drain of the first PMOS FET. The first inductor $L_1$ is connected between the ground and the drain of the first PMOS FET. A source of the first PMOS FET is connected to Vcc. The drain of the first PMOS FET outputs the oscillating signal.

The second capacitor array 55 is connected to both a gate of the first PMOS FET and a drain of the second PMOS FET. The second inductor $L_2$ is connected between ground and the drain of the second PMOS FET. A source of the second PMOS FET is connected to Vcc.

Alternatively, the sources of both the first PMOS FET and the second PMOS FET are connected to ground via a third PMOS FET, wherein the source of the first PMOS FET is connected to a drain of the third PMOS FET, a source of the third PMOS FET is connected to ground, and a gate of the third PMOS FET is connected to a bias voltage $V_b$.

Figure 7:
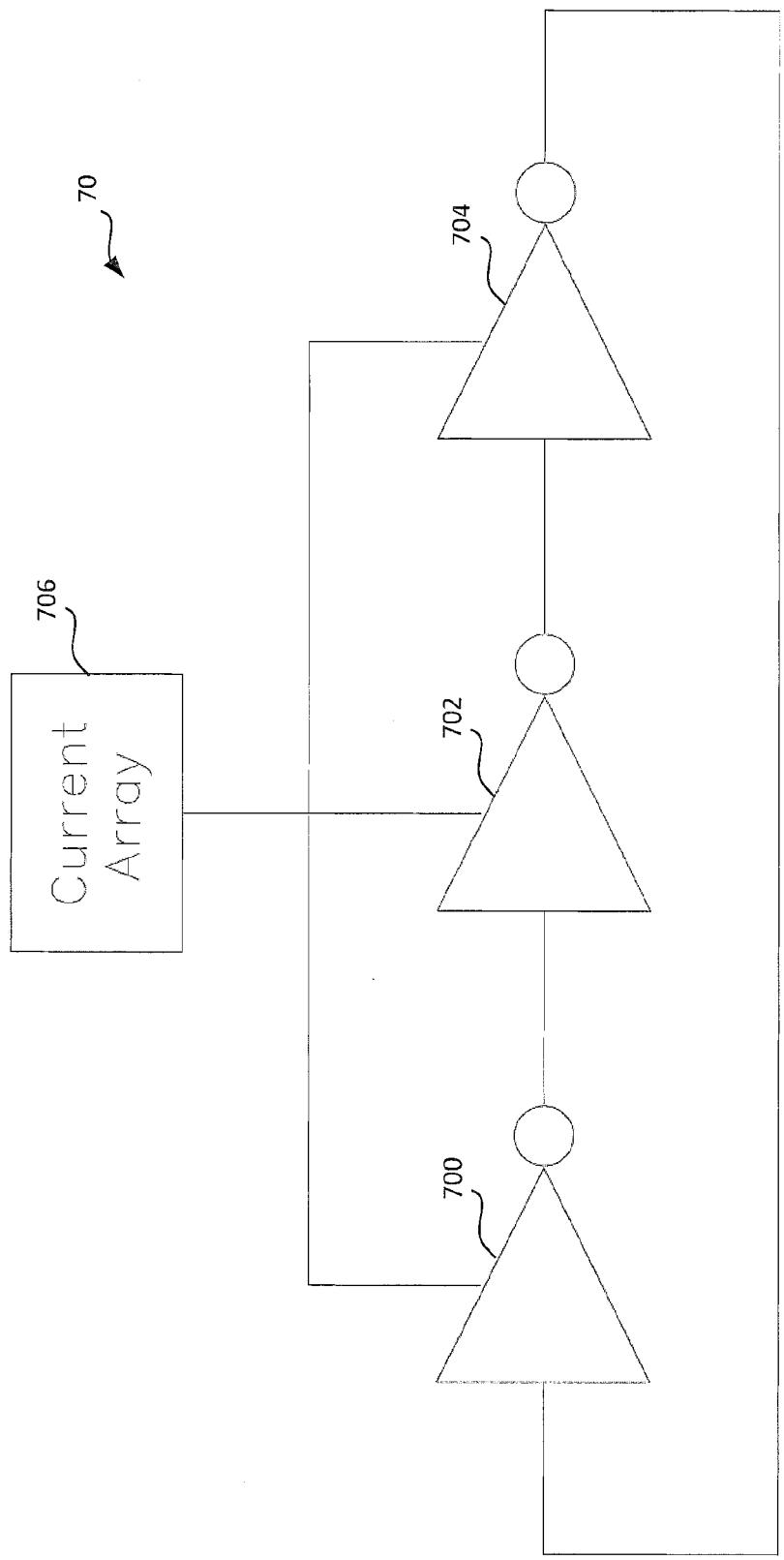
FIG. 7 is a circuit diagram illustrating a structure of the circuit according to another embodiment of the invention.

FIG. 7 is a circuit diagram illustrating a structure of the circuit according to another embodiment of the invention.

Figure 8:
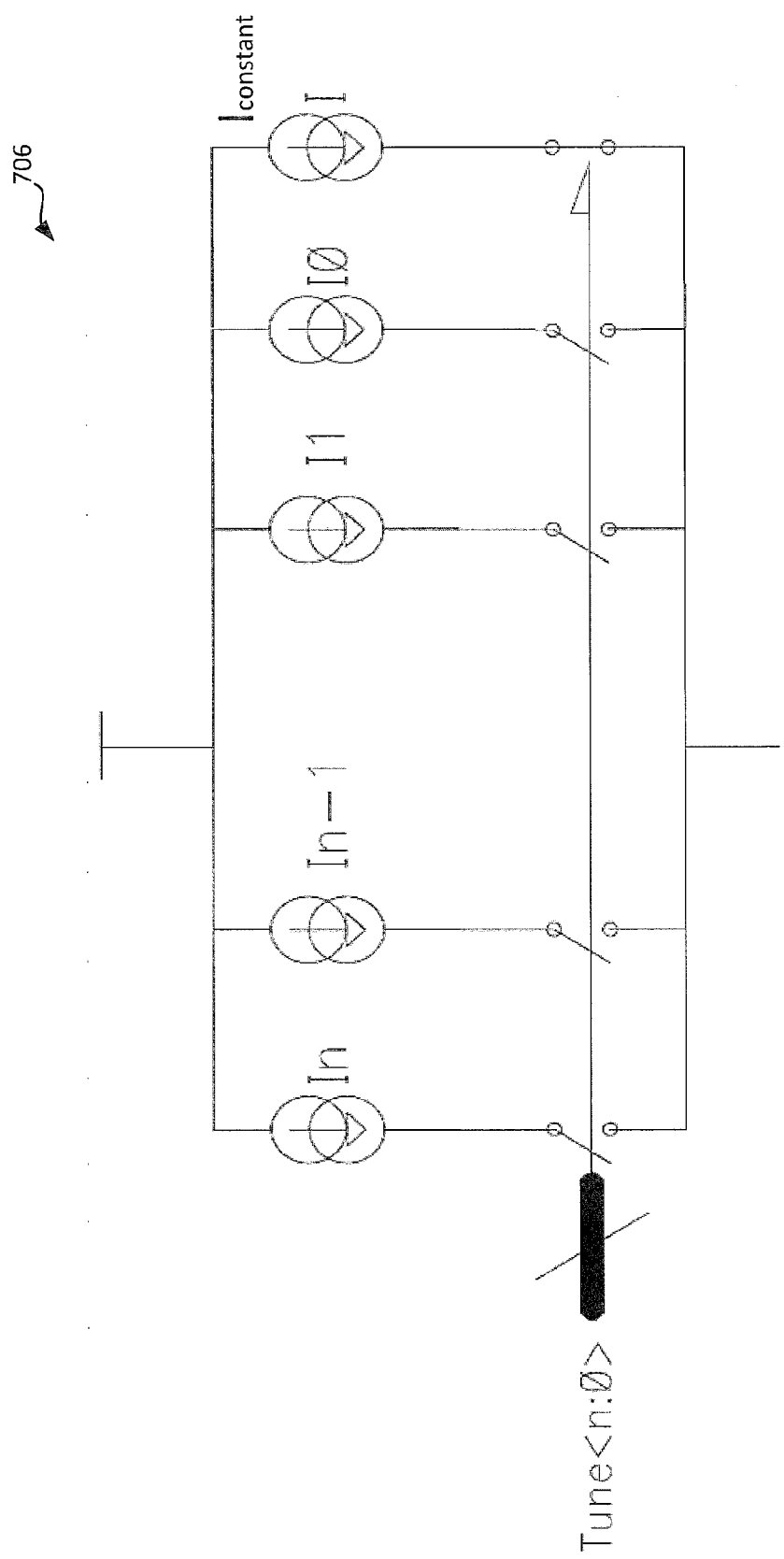
FIG. 8 is a circuit diagram illustrating a topology of a current array shown in FIG. 7 according to an embodiment of the invention.

Referring back to FIG. 1, the oscillator 100 can be implemented by the oscillator 70 shown in FIG. 7. The oscillator 70 comprises a plurality of inverters 700, 702, 704 and a current source array 706. The current source array 706 comprises a plurality of individual current sources as shown in FIG. 8. The current source array 706 obtains the comparison result from a comparator 120, adjusts a current of the current source array 706 fed to the plurality of the inverters 700, 702 and 704 according to the comparison result.

FIG. 8 is a circuit diagram illustrating a topology of a current source array 706 shown in FIG. 7 according to an embodiment of the invention.

In one embodiment, the current source array 706 comprises a plurality of current sources, and the current of the plurality of the current sources are arranged in a binary order according to the equation $i_n=2\times i_{n-1}$. In other words, $i_n=2^n \times i_0$. For example, $i_2=4 \times i_0$.

Alternatively, the current source array 706 comprises a plurality of individual current sources. A current of a first current source is less than the sum of current of all the other current sources that are less than the first current source and the current of a least significant bit of the current source array 706. In other words, $i_n < i_{n-1}+i_{n-2}+ \ldots +i_1+i_0+i_0$. Note that if the frequency range of the oscillator does not start from zero, for example, if the operation frequency of the oscillator ranges from 2.2 GHz to 2.6 GHz, the current source array 706 may further comprises a constant current source $i_{constant}$. In the presence of 3 inverters, the oscillation frequency can be expressed as $$f = \frac{1}{6\tau},$$

where $\tau$ represents the time constant and can be adjusted by the current source array 706.

Figure 9:
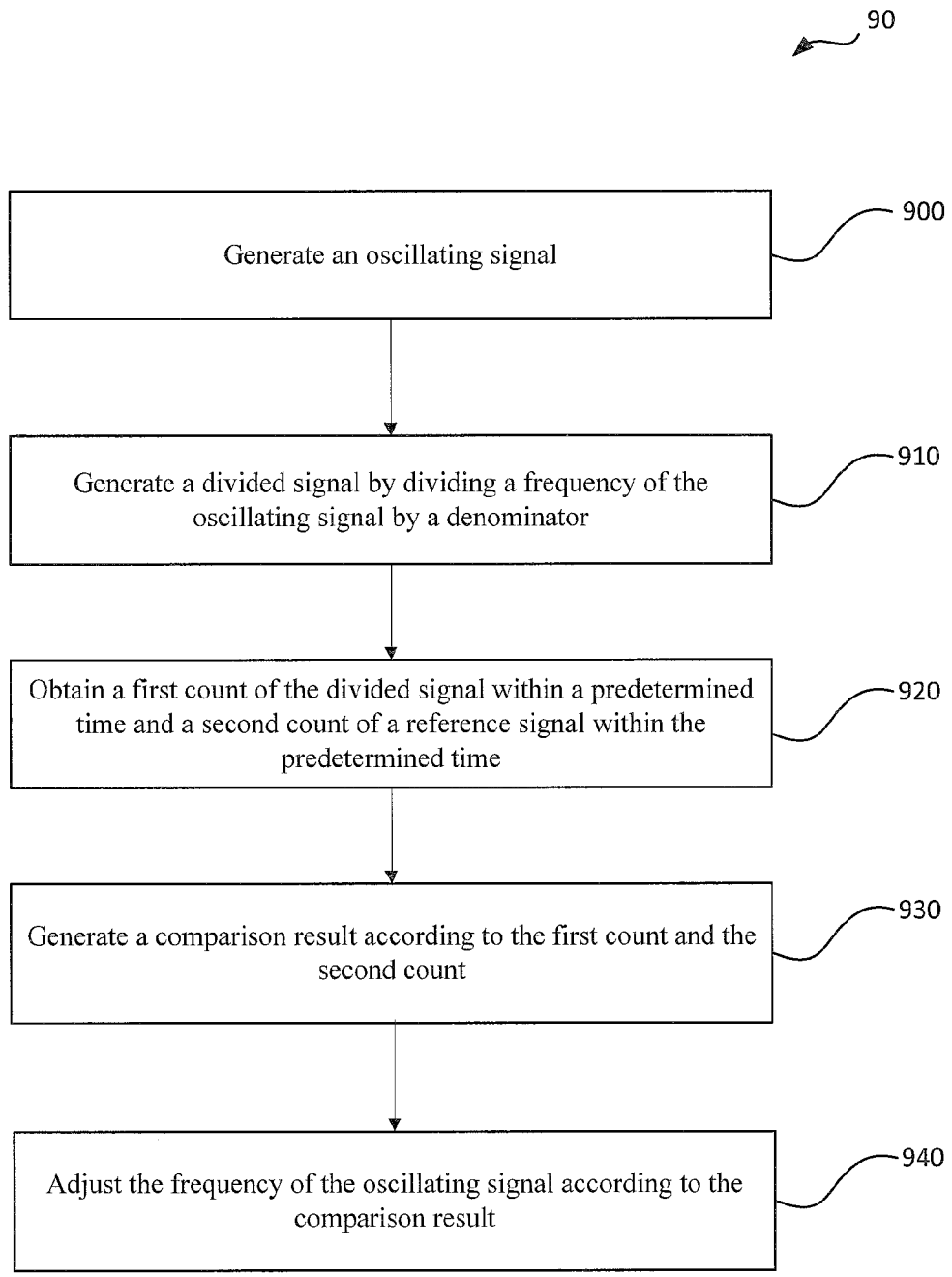
FIG. 9 is a flowchart illustrating a method of operating the circuit according to an embodiment of the invention.

FIG. 9 is a flowchart illustrating a method 90 of operating the circuit according to an embodiment of the invention. The method 90 comprises generating (in 900) an oscillating signal ($F_{vco}$) by an oscillator, generating (in 910) a divided signal ($F_{vco}/N_1$) by dividing a frequency of the oscillating signal by a denominator; obtaining (in 920) a first count of the divided signal within a predetermined time and a second count of a reference signal within the predetermined time; generating (in 930) a comparison result according to a comparison of the first count and the second count; and adjusting (in 940) the frequency of the oscillating signal according to the comparison result.

Alternatively, the oscillator comprises a first inductor communicatively coupled to a first capacitor array 50. The method 90 further comprises (not shown in FIG. 9) obtaining the comparison result; and adjusting the capacitance of the first capacitor array 50 according to the comparison result.

Alternatively, the method 90 further comprises increasing the capacitance of the first capacitor array 50 if the comparison result indicates that the first count is larger than or equal to the second count; and decreasing the capacitance of the first capacitor array 50 connected to the first inductor if the comparison result indicates that the first count is smaller than the second count.

Alternatively, the first capacitor array 50 comprises a plurality of individually switched capacitors, wherein a capacitance of a first capacitor is less than the sum of capacitances of all the other capacitors that are less than the first capacitor and the capacitance of a least significant bit of the first capacitor array 50.

Alternatively, the first capacitor array 50 comprises a plurality of individually switched capacitors, wherein the capacitances of the plurality of the individually switched capacitors are arranged in a binary order according to the equation $C_n=2\times C_{n-1}$.

Alternatively, the oscillator comprises a plurality of inverters and a current source array 706, the current source array 706 comprises a plurality of current source. The method further comprises (not shown in FIG. 9) obtaining the comparison result; adjusting a current of the current source array 706 fed to the plurality of the inverters according to the comparison result.

Alternatively, the current source array 706 comprises a plurality of individual current sources, and a current of a first current source is less than the sum of current of all the other current sources that are less than the first current source and the current of a least significant bit of the current source array 706.

Alternatively, the current source array 706 comprises a plurality of current sources, and the current of the plurality of the current sources are arranged in a binary order according to the equation $i_n=2\times i_{n-1}$.

Figure 10:
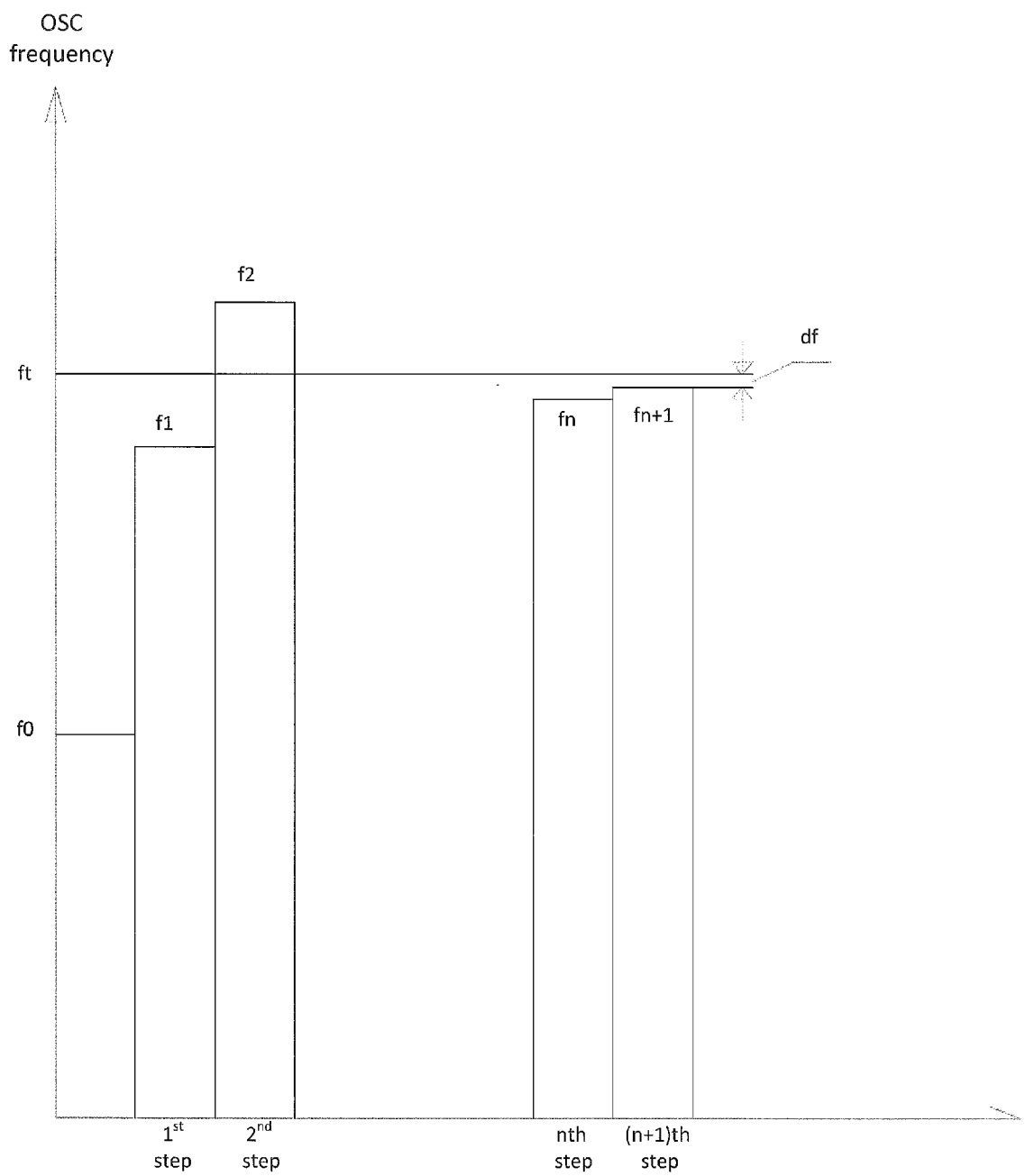
FIG. 10 is a chart illustrating the adjusting steps of the oscillation frequency according to an embodiment of the invention.

FIG. 10 is a chart illustrating the adjusting steps of the oscillation frequency according to an embodiment of the invention. In FIG. 10 OSC frequency represents the oscillation frequency of the oscillator. $F_t$ represents a target frequency for the oscillator. Note that the target frequency $F_t$ can be the same as frequency of the reference clock $F_{re}$ shown in FIG. 2. $F_0$ represents the frequency when all the capacitors are switched on. In other word, Tune<n:0>=$2^{n+1}-1$. Then in the first step, the MSB $C_n$ is switched off, while all the other bits are on, and the corresponding frequency is denoted as $f_1$. $f_1$ is less than the target frequency $f_t$. Then in step 2, the MSB (or the $n^{th}$ bit) $C_n$ remains switched off, and the n-$1^{th}$ bit $C_{n-1}$ is switched off and all the other bits are on, and the corresponding frequency is denoted as $f_2$. The iteration continues, until the LSB capacitor $C_0$ has been determined. The term df represents the offset frequency between the calibrated frequency and the target frequency.

It should be appreciated by those skilled in the art that components from different embodiments may be combined to yield another technical solution. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit comprising:
   an oscillator configured to generate an oscillating signal (Fvco);
   a frequency divider communicatively coupled to the oscillator and configured to generate a divided signal (Fvco/N) by dividing a frequency of the oscillating signal by a denominator (N1);

a comparator communicatively coupled to the oscillator and the frequency divider and configured to:
  obtain a first count of the divided signal within a predetermined time and a second count of a reference signal within the predetermined time;
  compare the first count with the second count, and
  generate a comparison result according to the first count and the second count; wherein
the oscillator is further configured to adjust the frequency of the oscillating signal according to the comparison result;
wherein the oscillator comprises a first inductor communicatively coupled to a first capacitor array, wherein
the first capacitor array is configured to:
  obtain the comparison result;
  adjust the capacitance of the first capacitor array according to the comparison result;
wherein the first capacitor array comprises a plurality of individually switched capacitors, wherein a capacitance of a first capacitor is less than the sum of capacitances of all the other capacitors that are less than the first capacitor and the capacitance of a least significant bit of the first capacitor array.

2. The circuit of claim 1, wherein the first capacitor array is further configured to:
  increase the capacitance of the first capacitor array if the comparison result indicates that the first count is larger than or equal to the second count; and
  decrease the capacitance of the first capacitor array connected to the first inductor if the comparison result indicates that the first count is smaller than the second count.

3. A circuit, comprising:
an oscillator configured to generate an oscillating signal (Fvco);
a frequency divider communicatively coupled to the oscillator and configured to generate a divided signal (Fvco/N) by dividing a frequency of the oscillating signal by a denominator (N1);
a comparator communicatively coupled to the oscillator and the frequency divider and configured to:
  obtain a first count of the divided signal within a predetermined time and a second count of a reference signal within the predetermined time;
  compare the first count with the second count, and
  generate a comparison result according to the first count and the second count; wherein the oscillator is further configured to adjust the frequency of the oscillating signal according to the comparison result;
wherein the oscillator comprises a first inductor communicatively coupled to a first capacitor array, wherein
the first capacitor array is configured to:
  obtain the comparison result;
  adjust the capacitance of the first capacitor array according to the comparison result;
wherein the first capacitor array comprises a plurality of individually switched capacitors, wherein the capacitances of the plurality of the individually switched capacitors are arranged in a binary order according to the equation Cn=2×Cn−1.

4. A circuit, comprising:
an oscillator configured to generate an oscillating signal (Fvco);
a frequency divider communicatively coupled to the oscillator and configured to generate a divided signal (Fvco/N) by dividing a frequency of the oscillating signal by a denominator (N1);
a comparator communicatively coupled to the oscillator and the frequency divider and configured to:
  obtain a first count of the divided signal within a predetermined time and a second count of a reference signal within the predetermined time;
  compare the first count with the second count, and
  generate a comparison result according to the first count and the second count; wherein the oscillator is further configured to adjust the frequency of the oscillating signal according to the comparison result;
wherein the oscillator comprises a first inductor communicatively coupled to a first capacitor array, wherein
the first capacitor array is configured to:
  obtain the comparison result;
  adjust the capacitance of the first capacitor array according to the comparison result;
wherein the oscillator further comprises a second inductor, a second capacitor array, a first NMOS FET, a second NMOS FET, wherein
the first capacitor array is connected to both a gate of the second NMOS FET and a drain of the first NMOS FET, the first inductor is connected between Vcc and the drain of the first NMOS FET, and a source of the first NMOS FET is connected to ground, and
the second capacitor array is connected to both a gate of the first NMOS FET and a drain of the second NMOS FET, the second inductor is connected between the Vcc and the drain of the second NMOS FET, and a source of the second NMOS FET is connected to ground.

5. The circuit of claim 4, wherein the sources of both the first NMOS FET and the second NMOS FET are connected to ground via a third NMOS FET, wherein the source of the first NMOS FET is connected to a drain of the third NMOS FET, a source of the third NMOS FET is connected to ground, and a gate of the third NMOS FET is connected to a bias voltage.

6. A circuit, comprising:
an oscillator configured to generate an oscillating signal (Fvco);
a frequency divider communicatively coupled to the oscillator and configured to generate a divided signal (Fvco/N) by dividing a frequency of the oscillating signal by a denominator (N1);
a comparator communicatively coupled to the oscillator and the frequency divider and configured to:
  obtain a first count of the divided signal within a predetermined time and a second count of a reference signal within the predetermined time;
  compare the first count with the second count, and
  generate a comparison result according to the first count and the second count; wherein the oscillator is further configured to adjust the frequency of the oscillating signal according to the comparison result;
wherein the oscillator comprises a first inductor communicatively coupled to a first capacitor array, wherein
the first capacitor array is configured to:
  obtain the comparison result;
  adjust the capacitance of the first capacitor array according to the comparison result;
wherein the oscillator further comprises a second inductor, a second capacitor array, a first PMOS FET, a second PMOS FET, wherein
the first capacitor array is connected to both a gate of the second PMOS FET and a drain of the first PMOS FET, the first inductor is connected between the ground and the drain of the first PMOS FET, and a source of the first PMOS FET is connected to Vcc, and the second capacitor array is connected to both a gate of the first PMOS FET and a drain of the second PMOS FET, the second inductor is connected between ground and the drain of the second PMOS FET, and a source of the second PMOS FET is connected to Vcc.

7. A circuit, comprising:
an oscillator configured to generate an oscillating signal (Fvco);
a frequency divider communicatively coupled to the oscillator and configured to generate a divided signal (Fvco/N) by dividing a frequency of the oscillating signal by a denominator (N1);
a comparator communicatively coupled to the oscillator and the frequency divider and configured to:
  obtain a first count of the divided signal within a predetermined time and a second count of a reference signal within the predetermined time;
  compare the first count with the second count, and generate a comparison result according to the first count and the second count;
wherein
the oscillator is further configured to adjust the frequency of the oscillating signal according to the comparison result;
wherein the oscillator comprises a plurality of inverters and a current source array, the current source array comprises a plurality of individual current source, wherein the current source array is configured to:
  obtain the comparison result;
  adjust a current of the current source array fed to the plurality of the inverters according to the comparison result;
wherein the current source array comprises a plurality of individual current sources, and a current of a first current source is less than the sum of current of all the other current sources that are less than the first current source and the current of a least significant bit of the current source array.

8. A circuit, comprising:
an oscillator configured to generate an oscillating signal (Fvco);
a frequency divider communicatively coupled to the oscillator and configured to generate a divided signal (Fvco/N) by dividing a frequency of the oscillating signal by a denominator (N1);
a comparator communicatively coupled to the oscillator and the frequency divider and configured to:
  obtain a first count of the divided signal within a predetermined time and a second count of a reference signal within the predetermined time
  compare the first count with the second count, and generate a comparison result according to the first count and the second count;
wherein
the oscillator is further configured to adjust the frequency of the oscillating signal according to the comparison result;
wherein the oscillator comprises a plurality of inverters and a current source array, the current source array comprises a plurality of individual current source, wherein the current source array is configured to:
  obtain the comparison result;
  adjust a current of the current source array fed to the plurality of the inverters according to the comparison result;
wherein the current source array comprises a plurality of current sources, and the current of the plurality of the current sources are arranged in a binary order according to the equation in=2×in−1.

9. A method, comprising:
generating an oscillating signal (Fvco) by an oscillator;
generating a divided signal by dividing a frequency of the oscillating signal by a denominator;
obtaining a first count of the divided signal (Fvco/N) within a predetermined time and a second count of a reference signal within the predetermined time;
generating a comparison result according to a comparison of the first count and the second count;
adjusting the frequency of the oscillating signal according to the comparison result;
  wherein the oscillator comprises a first inductor communicatively coupled to a first capacitor array;
obtaining the comparison result; and
adjusting the capacitance of the first capacitor array according to the comparison result wherein the first capacitor array comprises a plurality of individually switched capacitors, wherein a capacitance of a first capacitor is less than the sum of capacitances of all the other capacitors that are less than the first capacitor and the capacitance of a least significant bit of the capacitor array.

10. The method of claim 9, further comprising:
increasing the capacitance of the first capacitor array if the comparison result indicates that the first count is larger than or equal to the second count; and
decreasing the capacitance of the first capacitor array connected to the first inductor if the comparison result indicates that the first count is smaller than the second count.

11. A method, comprising:
generating an oscillating signal (Fvco) by an oscillator;
generating a divided signal by dividing a frequency of the oscillating signal by a denominator;
obtaining a first count of the divided signal (Fvco/N) within a predetermined time and a second count of a reference signal within the predetermined time;
generating a comparison result according to a comparison of the first count and the second count;
adjusting the frequency of the oscillating signal according to the comparison result;
wherein the oscillator comprises a first inductor communicatively coupled to a first capacitor array;
obtaining the comparison result; and
adjusting the capacitance of the first capacitor array according to the comparison result;
wherein the first capacitor array comprises a plurality of individually switched capacitors, wherein the capacitances of the plurality of the individually switched capacitors are arranged in a binary order according to the equation Cn=2×Cn−1.

12. A method, comprising:
generating an oscillating signal (Fvco) by an oscillator;
generating a divided signal by dividing a frequency of the oscillating signal by a denominator;
obtaining a first count of the divided signal (Fvco/N) within a predetermined time and a second count of a reference signal within the predetermined time;
generating a comparison result according to a comparison of the first count and the second count;
adjusting the frequency of the oscillating signal according to the comparison result
wherein the oscillator comprises a first inductor communicatively coupled to a first capacitor array;

obtaining the comparison result; and adjusting the capacitance of the first capacitor array according to the comparison result;

wherein the oscillator comprises a plurality of inverters and a current source array, the current source array comprises a plurality of current source;

wherein the current source array comprises a plurality of individual current sources, and a current of a first current source is less than the sum of current of all the other current sources that are less than the first current source and the current of a least significant bit of the current source array.

13. The method of claim 12, wherein the current source array comprises a plurality of current sources, and the current of the plurality of the current sources are arranged in a binary order according to the equation in=2×in−1.

* * * * *